United States Patent
Kim et al.

(10) Patent No.: US 7,582,542 B2
(45) Date of Patent: Sep. 1, 2009

(54) DIE ATTACHING METHOD

(75) Inventors: Dae-Young Kim, Chungcheongnam-do (KR); Joung-Min Oh, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 17 days.

(21) Appl. No.: 11/552,416

(22) Filed: Oct. 24, 2006

(65) Prior Publication Data

US 2007/0184564 A1      Aug. 9, 2007

(30) Foreign Application Priority Data

Feb. 3, 2006      (KR)      ............ 10-2006-0010713

(51) Int. Cl.
*H01L 21/00*      (2006.01)
(52) U.S. Cl. ............ 438/464; 438/14; 438/15; 257/E23.179
(58) Field of Classification Search .......... 257/E23.179, 257/48; 438/14, 113, 114, 460–465, 15; 700/108; 356/401
See application file for complete search history.

(56) References Cited

U.S. PATENT DOCUMENTS

| | | | | |
|---|---|---|---|---|
| 5,986,766 A * | 11/1999 | Koga et al. | ............ | 356/401 |
| 6,156,625 A * | 12/2000 | Balamurugan | ............ | 438/462 |
| 6,937,916 B2 * | 8/2005 | Badar | ............ | 700/121 |
| 7,223,320 B2 * | 5/2007 | Arneson et al. | ............ | 156/344 |
| 7,353,077 B2 * | 4/2008 | Lin et al. | ............ | 700/121 |
| 2004/0126004 A1 * | 7/2004 | Kikuchi | ............ | 382/141 |
| 2005/0130333 A1 * | 6/2005 | Zhong et al. | ............ | 438/16 |
| 2006/0252182 A1 * | 11/2006 | Wang et al. | ............ | 438/110 |
| 2007/0288219 A1 * | 12/2007 | Zafar et al. | ............ | 703/14 |
| 2008/0267745 A1 * | 10/2008 | Schiller | ............ | 414/222.02 |

OTHER PUBLICATIONS

Bourolleau, J, et al. "Secure Die Picking of Known Good Die", May 1996, IBM, Technical Disclosure Bulletin, vol. 39, No. 05, p. 261.*
Zafar, et al. "Methods and Systems for Utilizing Design Data in Combination with Inspection Data", Nov. 18, 2005, U.S. Appl. No. 60/737,947.*
English language abstract for Korean Publication No. 1998-057551.
English language abstract for Korean Publication No. 08-008588.
English language abstract for Japanese Publication No. 2000-269306.

* cited by examiner

*Primary Examiner*—M. Wilczewski
*Assistant Examiner*—Joseph C Nicely
(74) *Attorney, Agent, or Firm*—Marger Johnson & McCollom, P.C.

(57) ABSTRACT

A die attaching method for attaching semiconductor dies on wafers, each wafer having a first center point and a first radius may include expanding a wafer carrier tape so that the wafer has a second center point and a second radius, measuring the second center point and second radius of the wafer, adding the difference between the first radius and the second radius to a first coordinate value of a first die to calculate a second coordinate value of the first die, and picking up and attaching the semiconductor dies consecutively from the first die. Calculating the second coordinate value of the first die may include compensating the first center point of the wafer based on the second center point of the wafer to calculate the positional coordinate of the semiconductor dies including the first die.

14 Claims, 8 Drawing Sheets

FIG.8

| X71781Y20280 | X81375Y47183 | D5915.9 |

POSITION OF FIRST DIE | CENTER POINT OF WAFER | DIAMETER OF WAFER

DIE ATTACHING METHOD

RELATED APPLICATION

This application claims priority under 35 U.S.C. § 119 from Korean Patent Application No. 2006-10713 filed on Feb. 3, 2006, the contents of which are incorporated herein by reference in their entirety.

BACKGROUND

1. Technical Field

The present disclosure relates to an improved die attaching method.

2. Description of the Related Art

A wafer fabrication process may form integrated circuits in or on a semiconductor wafer. An electrical die sorting (EDS) test may sort semiconductor dies into good or reject ones. A wafer sawing process may divide a semiconductor wafer into individual semiconductor dies. A package assembly process may produce a semiconductor chip package using good dies.

Typical wafers may experience an inking process for inking reject dies after an EDS test. Alternatively, inkless wafers may be sorted using wafer map data available from the EDS test. Therefore, inkless wafers may not need an inking process and an inking mark reading process.

Instead, inkless wafers may require a matching process for matching a wafer with wafer map data. The matching process may search a wafer for a first die to be picked up. For example, the matching process may match a first die of an actual wafer with a first die of wafer map data. If a first die of wafer map data is mismatched with a first die of an actual wafer, a die attaching process may be performed incorrectly.

A conventional die attaching method may include a reference die searching method and a row/column chip counting method.

FIG. 1 is a plan view of a wafer 10 having a plurality of semiconductor dies 11 used in a conventional die attaching process using a reference die searching method. FIG. 2A is an enlarged view of section A in FIG. 1. FIG. 2B is an enlarged view of section B in FIG. 1.

Referring to FIGS. 1 to 2B, a wafer 10 may have mirror semiconductor dies 13 (e.g. semiconductor dies without integrated circuits) at two or three edge points thereof. A reference die searching method may recognize chip patterns (P1, P2) near the mirror semiconductor dies 13 to search for a first die 11a.

The mirror semiconductor die 13 may negatively impact production rate of a wafer 10, particularly a wafer having small-sized semiconductor dies. For example, a semiconductor die having a size of 3 mm or less may be liable to a first die search error that may result from the difference between expansion rate of a center area and expansion rate of an edge area on expanding a wafer carrier tape.

FIG. 3 is a plan view of a part of a wafer 30 used in a conventional die attaching process using a row/column chip counting method.

Referring to FIG. 3, the wafer 30 does not have mirror semiconductor dies. A row/column counting method may recognize chip patterns of the wafer 30 to measure the number of semiconductor dies 31, and match the actual number of semiconductor dies 31 of the wafer 30 with the number of semiconductor dies of wafer map data to search for a first die 31a.

However, if a semiconductor die 35 has chip patterns formed outside a good chip area, the row/column chip counting method may be liable to a chip count error. As a result, the actual number of semiconductor dies on row and column may be mismatched with the number of semiconductor dies on wafer map data.

The conventional die attaching method may not consider positional changes of semiconductor dies which may occur during a tape attaching process and/or a wafer sawing process on matching a first die of a wafer after tape expansion with a first die of wafer map data available from an EDS test, thus resulting in a first die search error. A chip count error during a die attaching process may lead to numerous reject dies being packaged as a good die.

SUMMARY

A die attaching method may attach semiconductor dies of wafers to a lead frame or a substrate. According to one embodiment, the die attaching method may comprise expanding or stretching a wafer carrier tape to increase the gap between the dies. A wafer before tape expansion may have a first center point and a first radius, and a wafer after tape expansion may have a second center point and a second radius. The second center point and second radius of the wafer may be measured. The difference between the first radius and the second radius may be added to a first coordinate value of a first die, thereby calculating a second coordinate value of the first die. The semiconductor dies may be picked up and attached consecutively from the first die. The wafer may be an inkless wafer.

Measuring the second center point and second radius of the wafer may include perceiving images of at least three edge points of the wafer and calculating the second center point and second radius from coordinate values of the wafer edge points obtained from the images.

The first center point and first radius of the wafer may be wafer map data available from an EDS test.

Calculating the second coordinate value of the first die may include compensating the first center point of the wafer based on the second center point of the wafer to calculate the positional coordinate of the semiconductor dies including the first die after tape expansion.

Calculating the second coordinate value of the first die may include calculating and comparing the positional coordinate of first dies of wafers. In the case that the dispersion ratio of a first die of a current wafer to a first die of a previous wafer is 30% or more, a die attaching process may be interrupted.

Therefore, the die attaching method may reduce the likelihood that errors may occur in searching for a first die to be picked up.

BRIEF DESCRIPTION OF THE DRAWINGS

Exemplary embodiments will be described with reference to the accompanying drawings, wherein like reference numerals designate like structural elements, and, in which:

FIG. 8 is a view illustrating a part of wafer map data available from an EDS test.

DETAILED DESCRIPTION OF THE EXAMPLE EMBODIMENTS

Example embodiments will be described below with reference to the accompanying drawings. It will be understood that the depicted elements may be simplified and/or are merely exemplary, and may not necessarily be drawn to scale.

Figure 1:
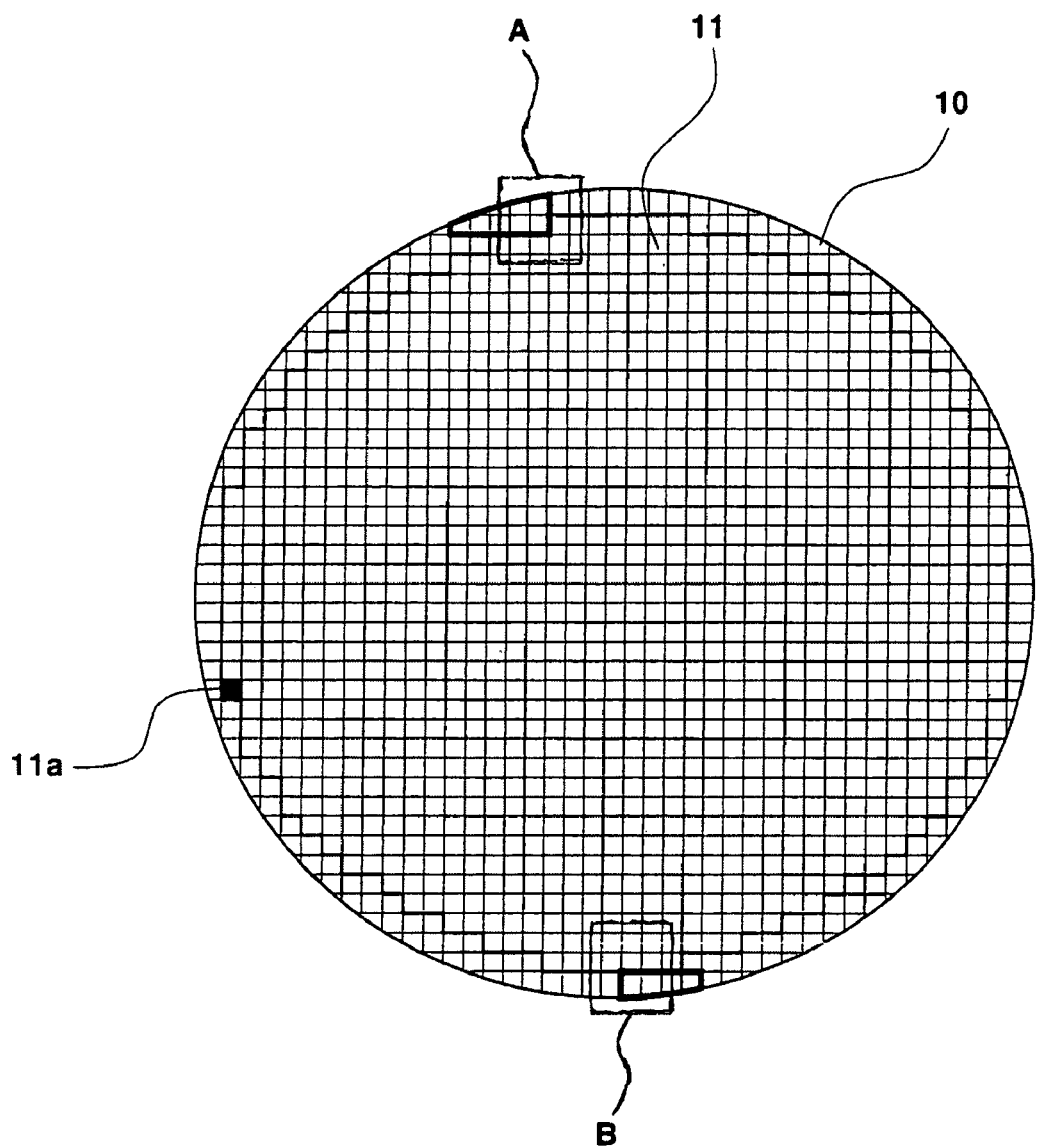
FIG. 1 is a plan view of a wafer used in an example of a conventional die attaching method.
Figure 2A:
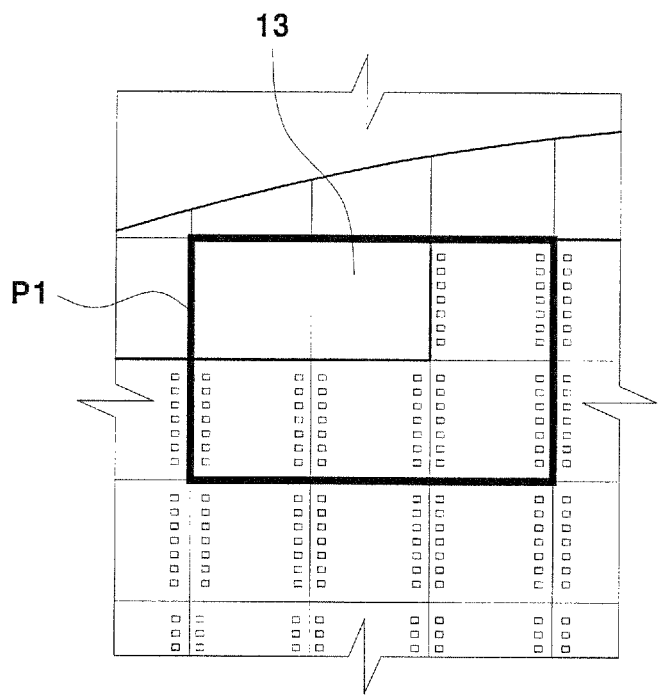
FIG. 2A is an enlarged view of section A in FIG. 1.
Figure 2B:
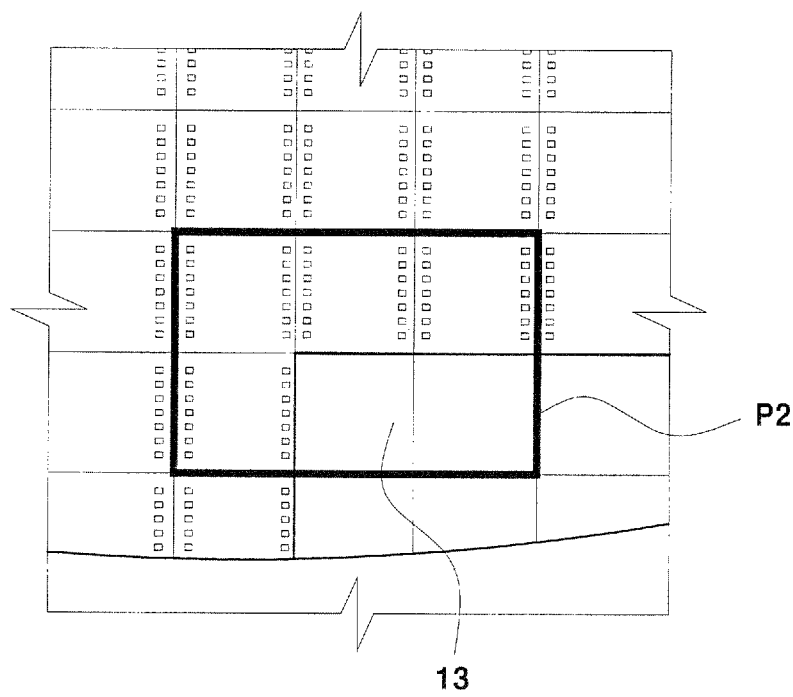
FIG. 2B is an enlarged view of section B in FIG. 1.
Figure 3:
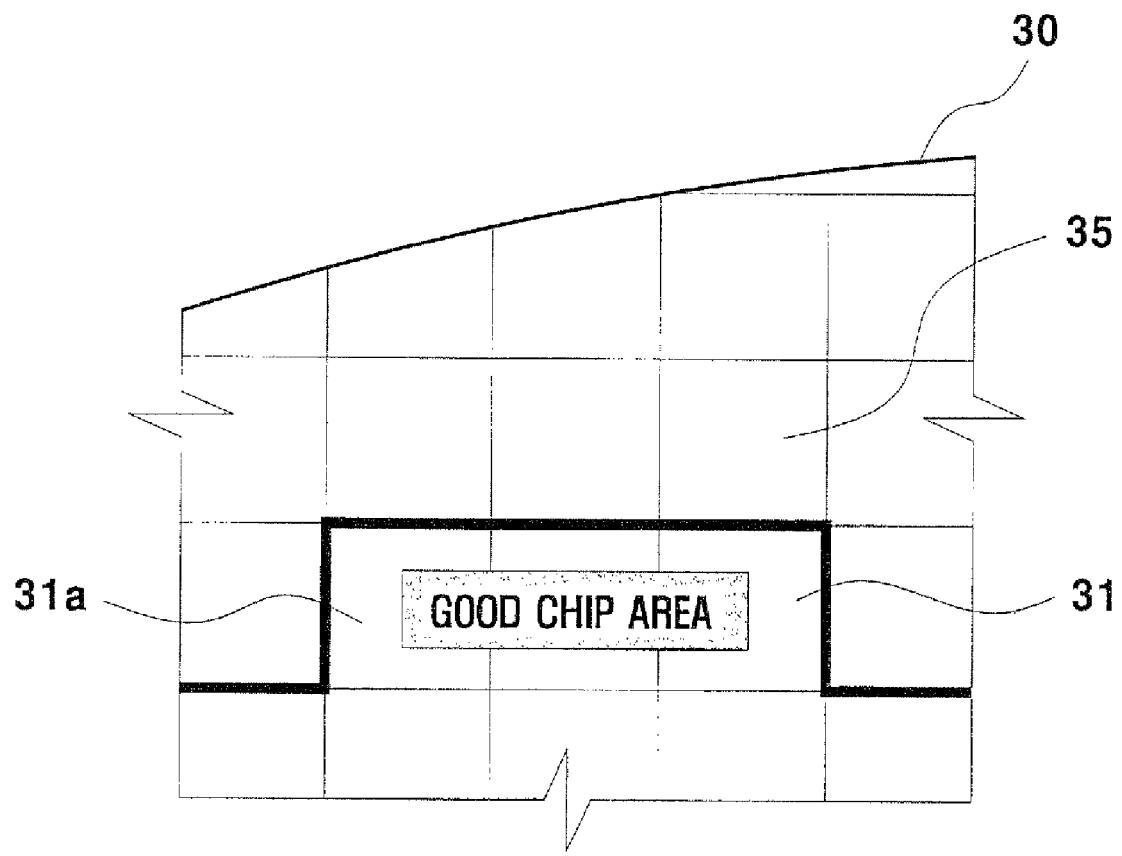
FIG. 3 is a plan view of a part of a wafer used in another example of a conventional die attaching method.
Figure 4:
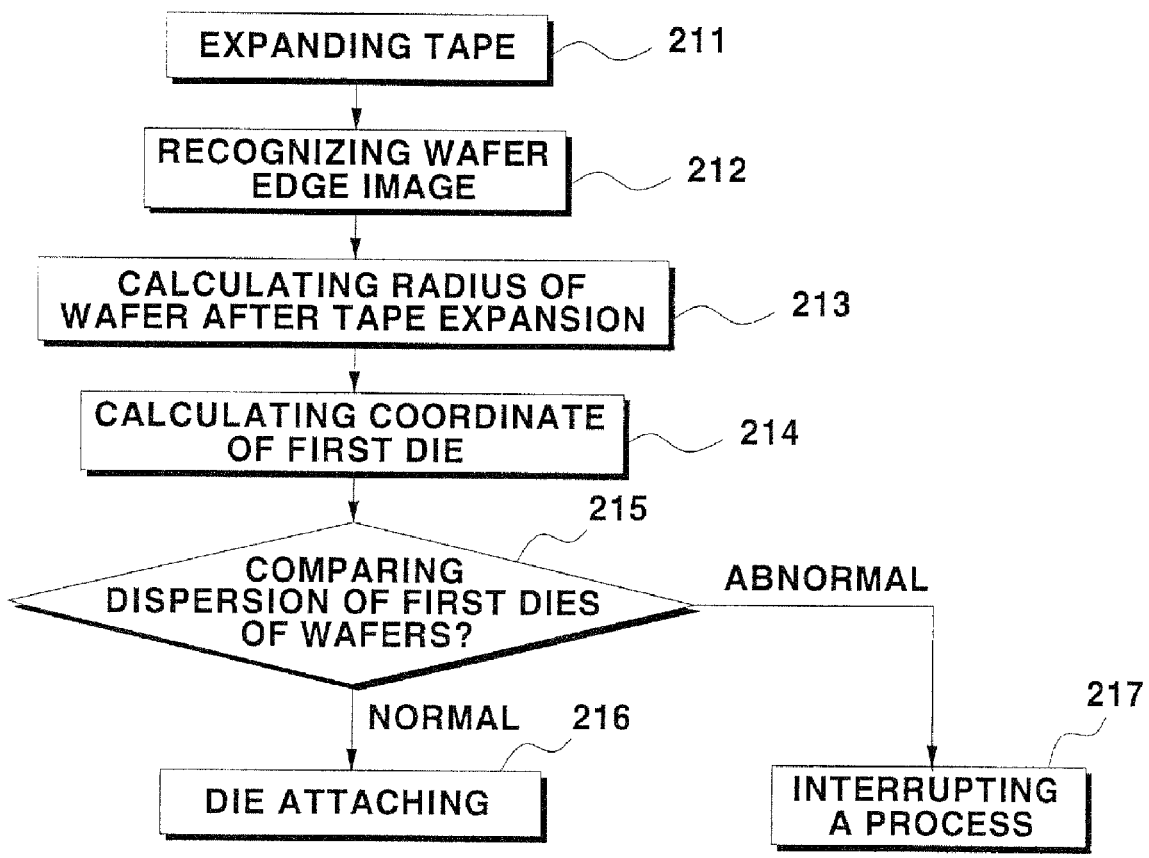
FIG. 4 is a flow chart of a die attaching method in accordance with an example embodiment.
Figure 5:
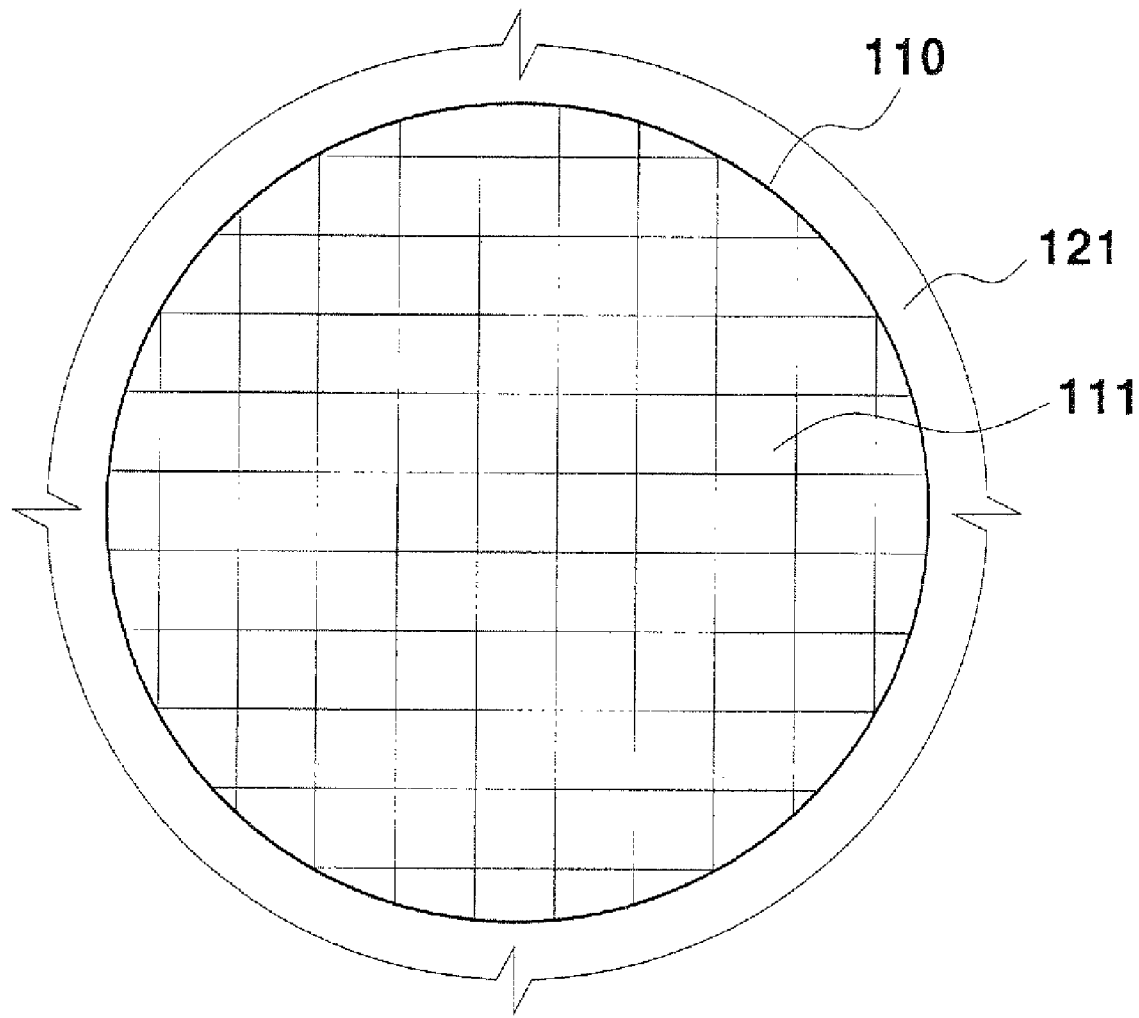
FIG. 5 is a plan view of a wafer before tape expansion.
Figure 6:
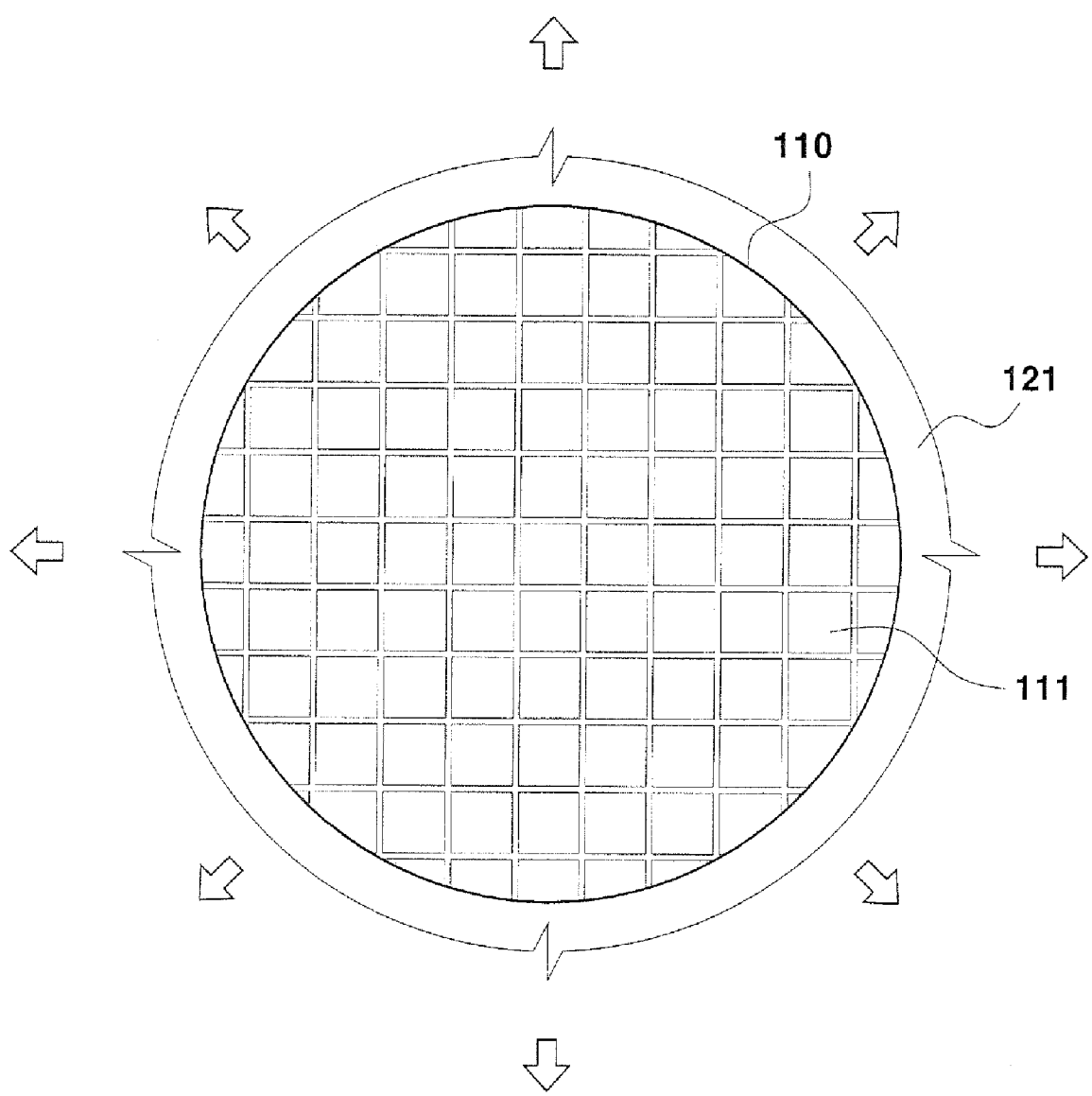
FIG. 6 is a plan view of a wafer after tape expansion.

FIG. 4 is a flow chart of a die attaching method in accordance with an example embodiment. FIG. 5 is a plan view of a wafer before tape expansion. FIG. 6 is a plan view of a wafer after tape expansion.

Referring to FIGS. 4 to 6, the die attaching method may begin with a step for expanding a wafer carrier tape 121 (211). The wafer carrier tape 121 may support a wafer 110 including a plurality of semiconductor dies 111. As the wafer carrier tape 121 supporting the wafer 110 is expanded, the gaps between the semiconductor dies 111 of the wafer 110 may increase. Thereby the semiconductor dies 111 may be easily separated from the wafer 110. The wafer 110 may be an inkless wafer which may not require an inking process to ink reject dies after an EDS test. If a wafer is provided with wafer map data available from an EDS test, the wafer with or without an inking process may be used.

A step for recognizing edge images of the wafer 110 may be performed (212). The images of at least three edge points of the wafer 110 may be recognized using an image sensing means, for example a vision camera. Coordinate values of the at least three edge points of the wafer 110 may be calculated based on the recognized images. The coordinate value may be calculated using a program, which may operate an image sensing means.

Figure 7:
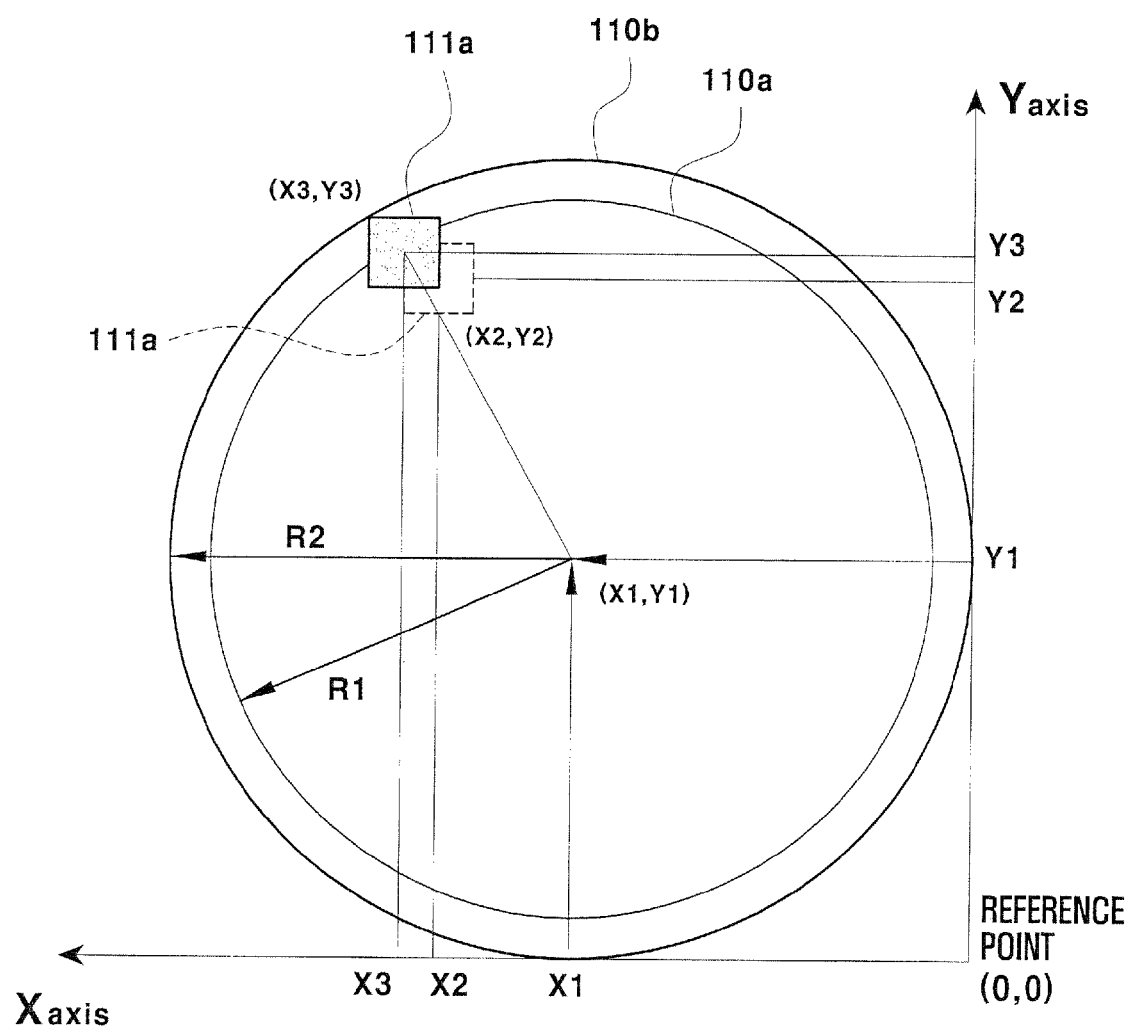
FIG. 7 is a view illustrating a method to calculate the coordinate of a first die.

FIG. 7 is a view illustrating a method to calculate the coordinate of a first die 111a. FIG. 8 is a view illustrating a part of wafer map data available from an EDS test.

Referring to FIG. 7, a step for calculating the radius of a wafer 110 after tape expansion may be performed (213). The coordinate values of at least three edge points of the wafer 110 may teach the center point and the radius of the wafer 110. This may be similar to the theory by which the coordinates of three points of a triangle may teach the center point and the radius of a circle. The coordinate values may be automatically calculated by a computer program.

A wafer 110a before tape expansion has a first radius (R1) and a wafer 10b after tape expansion has a second radius (R2). The difference between the first radius (R1) and the second radius (R2) may be calculated. Based on the difference, the coordinates of semiconductor dies 111 including the coordinate (X3,Y3) of a first die 111a of the wafer 110b may be calculated. First die 111a may also be called a reference die.

The first radius (R1) and the coordinate (X1,Y1) of a first center point of the wafer 10a may be provided from wafer map data available from an EDS test. The wafer map data may include positional information of a first die, a coordinate of a center point and a diameter of the wafer 110a, as shown in FIG. 8. The difference between the first radius (R1) and the second radius (R2) may be added to a coordinate (X2,Y2) of a first die of the wafer 110a. Therefore, the coordinate (X3, Y3) of the first die 111a of the wafer 110b may be calculated.

When the coordinate (X1,Y1) of a first center point of the wafer 110a is different from the coordinate of a second center point of the wafer 110b, a positional change value of a center point may be calculated as a compensation ratio by distance and reflected in positional information of semiconductor dies 111 of the wafer 110b.

A step for calculating and comparing the dispersion of first dies of wafers may be performed (215). If the dispersion ratio of a first die of a current wafer to a first die of a previous wafer exceeds a specific ratio, a die attaching process may be interrupted (217). If the dispersion ratio is within the range of the specific ratio, a die attaching process may continue (216).

For example, if the dispersion ratio of a first die of a current wafer to a first die of a previous wafer exceeds 30%, it may be difficult to continue a die attaching process. Thereby the process may be interrupted and an operational error of a die attaching apparatus may be checked. A run of wafers is twenty-five wafers. The dispersion ratio of a first die may be checked on die attaching for a new wafer, thereby securing the reliability of die attachment.

As apparent from the above description, a die attaching method in accordance with the example embodiment may calculate a positional compensation value of a semiconductor die based on the difference between the radius of a wafer before tape expansion and the radius of a wafer after tape expansion. The positional compensation value may be applied to wafer map data available from an EDS test. The positional compensation may be made by recognizing edge images of the wafer, thus eliminating the need for a mirror semiconductor die and reducing the likelihood of counting errors. The positional compensation of a semiconductor die may be made while a wafer carrier tape is expanded, thereby being hardly influenced by errors in a tape attaching process, a wafer sawing process and/or a die attaching process.

Although the preferred embodiments have been described in detail above, it should be understood that many variations and/or modifications of the basic inventive concepts herein taught, which may appear to those skilled in the art, will still fall within the spirit and scope of the invention as defined in the appended claims.

What is claimed is:

1. A die attaching method for attaching semiconductor dies of a plurality of wafers, each wafer having a first center point and a first radius, the method comprising:

mounting a wafer having semiconductor dies including a reference semiconductor die on a wafer carrier tape;

expanding the wafer carrier tape so that the wafer has a second center point and a second radius;

measuring the second center point and the second radius of the wafer;

adding the difference between the first radius and the second radius to a first coordinate value of the reference semiconductor die to calculate a second coordinate value of the reference semiconductor die; and picking up and attaching the remainder of the semiconductor dies consecutively from the reference semiconductor die.

2. The method of claim 1, wherein measuring the second center point and second radius of the wafer includes recognizing images of at least three edge points of the wafer and calculating the second center point and the second radius from coordinate values of the wafer edge points obtained from the images.

3. The method of claim 1, wherein the first center point and the first radius of the wafer are wafer map data available from an electrical die sorting test.

4. The method of claim 1, wherein calculating the second coordinate value of the reference semiconductor die includes compensating the first center point of the wafer based on the second center point of the wafer to calculate the positional coordinate of the semiconductor dies including the reference semiconductor die.

5. The method of claim 1, wherein the wafer is an inkless wafer.

6. A method for aligning a wafer for die attaching, the method comprising:
- obtaining the wafer including at least one semiconductor die;
- mounting the wafer on a wafer carrier tape;
- obtaining an unstretched wafer center point and an unstretched wafer radius;
- stretching the wafer carrier tape upon which the wafer is mounted;
- obtaining a stretched wafer center point and a stretched wafer radius, wherein obtaining the stretched wafer center point and the stretched wafer radius comprises recognizing edge images and calculating the stretched wafer center point and the stretched wafer radius from coordinate values of the edge images; and
- calculating a position of the semiconductor die based at least in part on the unstretched wafer radius and the stretched wafer radius.

7. The method of claim 6, wherein obtaining the unstretched wafer center point and the unstretched wafer radius comprises receiving data from an electrical die sorting test.

8. The method of claim 6, wherein recognizing edge images comprises recognizing images of at least three edge points of the wafer.

9. The method of claim 6, further comprising storing the position of the semiconductor die.

10. The method of claim 6, wherein calculating the position of the semiconductor die comprises comparing the stretched wafer center point with the unstretched wafer center point.

11. A method for aligning a wafer for die attaching, the method comprising:
- obtaining the wafer including at least one semiconductor die;
- mounting the wafer on a wafer carrier tape;
- obtaining an unstretched wafer center point and an unstretched wafer radius;
- stretching the wafer carrier tape upon which the wafer is mounted;
- obtaining a stretched wafer center point and a stretched wafer radius; and
- calculating a position of the semiconductor die based at least in part on the unstretched wafer radius and the stretched wafer radius, wherein calculating the position of the semiconductor die comprises adding the difference between the stretched wafer radius and the unstretched wafer radius to a reference position.

12. The method of claim 11, wherein the reference position is provided by an electrical die sorting test.

13. The method of claim 11, wherein obtaining the unstretched wafer center point and the unstretched wafer radius comprises receiving data from an electrical die sorting test.

14. The method of claim 11, further comprising storing the position of the semiconductor die.

* * * * *

UNITED STATES PATENT AND TRADEMARK OFFICE
CERTIFICATE OF CORRECTION

| | |
|---|---|
| PATENT NO. | : 7,582,542 B2 |
| APPLICATION NO. | : 11/552416 |
| DATED | : September 1, 2009 |
| INVENTOR(S) | : Dae-Young Kim et al. |

It is certified that error appears in the above-identified patent and that said Letters Patent is hereby corrected as shown below:

Column 3, line 47, the word "10$b$" should read -- 110$b$ --;

Column 3, line 54, the word "10$a$" should read -- 110$a$ --.

Signed and Sealed this

First Day of December, 2009

David J. Kappos
*Director of the United States Patent and Trademark Office*